United States Patent
Lin et al.

(10) Patent No.: US 10,262,997 B2
(45) Date of Patent: Apr. 16, 2019

(54) HIGH-VOLTAGE LDMOSFET DEVICES HAVING POLYSILICON TRENCH-TYPE GUARD RINGS

(71) Applicant: Vanguard International Semiconductor Corporation, Hsinchu (TW)

(72) Inventors: Shin-Cheng Lin, Tainan (TW);
Yeh-Jen Huang, Hsinchu (TW);
Fu-Hsin Chen, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/704,375

(22) Filed: Sep. 14, 2017

(65) Prior Publication Data

US 2019/0081045 A1    Mar. 14, 2019

(51) Int. Cl.
*H01L 29/06* (2006.01)
*H01L 29/08* (2006.01)
(Continued)

(52) U.S. Cl.
CPC ...... *H01L 27/0921* (2013.01); *H01L 29/0623* (2013.01); *H01L 29/0642* (2013.01);
(Continued)

(58) Field of Classification Search
CPC ......... H01L 29/66689; H01L 29/66659; H01L 29/7817; H01L 29/7823; H01L 29/7824; H01L 29/0642–29/0653; H01L 29/0619; H01L 29/0623; H01L 29/402–29/407; H01L 29/1087; H01L 27/0921; H01L 27/0928; H01L 21/76224; H01L 21/6763; H01L 21/763; H01L 29/66681–29/66704;
(Continued)

(56) References Cited

U.S. PATENT DOCUMENTS

| | | | | |
|---|---|---|---|---|
| 5,495,123 A | * | 2/1996 | Canclini | H01L 27/0248 257/355 |
| 6,118,152 A | * | 9/2000 | Yamaguchi | H01L 21/76264 257/347 |

(Continued)

*Primary Examiner* — Marc Anthony Armand
*Assistant Examiner* — Younes Boulghassoul
(74) *Attorney, Agent, or Firm* — Birch, Stewart, Kolasch & Birch, LLP

(57) ABSTRACT

A high-voltage semiconductor device including a semiconductor layer formed on a substrate is provided. A first well region having a first conductivity type and a second well region having a second conductivity type are formed in the semiconductor layer. Source and drain regions are respectively formed in the first and second well regions. A gate structure is disposed on the semiconductor layer. A first isolation trench structure is disposed in the semiconductor layer and surrounds the first and second well regions. The first isolation trench structure includes a first polysilicon layer filling a first trench and having the second conductivity type, a first heavy doping region formed in an upper portion of the first polysilicon layer and having the second conductivity type, and a first insulating liner disposed on sidewalls of the first trench and surrounding the first polysilicon layer.

16 Claims, 3 Drawing Sheets

(51) Int. Cl.
  *H01L 29/78*   (2006.01)
  *H01L 29/40*   (2006.01)
  *H01L 27/092*  (2006.01)
  *H01L 29/10*   (2006.01)

(52) U.S. Cl.
  CPC ...... *H01L 29/0865* (2013.01); *H01L 29/0882* (2013.01); *H01L 29/1087* (2013.01); *H01L 29/1095* (2013.01); *H01L 29/405* (2013.01); *H01L 29/7823* (2013.01)

(58) Field of Classification Search
  CPC ........ H01L 29/7816–29/7826; H01L 29/7835; H01L 29/1095; H01L 27/092; H01L 27/0922
  See application file for complete search history.

(56) References Cited

U.S. PATENT DOCUMENTS

| | | | | |
|---|---|---|---|---|
| 6,798,037 B2 * | 9/2004 | Leonardi | | H01L 21/763 257/507 |
| 6,972,458 B2 * | 12/2005 | Suzuki | | H01L 29/0696 257/330 |
| 8,476,736 B2 * | 7/2013 | Lee | | H01L 27/0255 257/547 |
| 9,306,060 B1 * | 4/2016 | Yang | | H01L 29/7823 |
| 9,761,707 B1 * | 9/2017 | Lin | | H01L 27/0629 |
| 9,786,665 B1 * | 10/2017 | Pendharkar | | H01L 27/0922 |
| 9,941,350 B1 * | 4/2018 | Lin | | H01L 29/0878 |
| 2005/0001265 A1 * | 1/2005 | Shiraki | | H01L 21/76286 257/330 |
| 2005/0073007 A1 * | 4/2005 | Chen | | H01L 29/1083 257/355 |
| 2008/0173949 A1 * | 7/2008 | Ma | | H01L 21/823878 257/371 |
| 2010/0032758 A1 * | 2/2010 | Wang | | H01L 29/1095 257/343 |
| 2011/0309441 A1 * | 12/2011 | Stecher | | H01L 21/187 257/338 |
| 2012/0049274 A1 * | 3/2012 | Elattari | | H01L 21/743 257/330 |
| 2014/0001545 A1 * | 1/2014 | Yang | | H01L 29/66689 257/337 |
| 2014/0070311 A1 * | 3/2014 | Yang | | H01L 29/66689 257/335 |
| 2014/0291767 A1 * | 10/2014 | Lee | | H01L 21/76229 257/368 |
| 2015/0041893 A1 * | 2/2015 | Wang | | H01L 29/7816 257/339 |
| 2015/0097238 A1 * | 4/2015 | Zhang | | H01L 29/6659 257/347 |
| 2015/0270333 A1 * | 9/2015 | Yang | | H01L 29/063 257/337 |
| 2016/0043217 A1 * | 2/2016 | Cai | | H01L 27/0922 257/337 |
| 2016/0087096 A1 * | 3/2016 | Yang | | H01L 29/7824 257/339 |
| 2016/0099242 A1 | 4/2016 | Mallikarjunaswamy | | |
| 2016/0155795 A1 * | 6/2016 | Feng | | H01L 29/1095 257/337 |
| 2016/0163583 A1 * | 6/2016 | Liu | | H01L 21/76229 257/401 |
| 2016/0181419 A1 * | 6/2016 | Ryu | | H01L 29/7816 257/343 |
| 2016/0322262 A1 * | 11/2016 | Li | | H01L 21/76224 |
| 2017/0062567 A1 * | 3/2017 | Kaya | | H01L 29/1087 |
| 2017/0062610 A1 * | 3/2017 | Agam | | H01L 29/0634 |
| 2017/0077296 A1 * | 3/2017 | Yang | | H01L 29/7823 |
| 2017/0179279 A1 * | 6/2017 | Lin | | H01L 29/66681 |
| 2017/0186741 A9 * | 6/2017 | Sheu | | H01L 27/0251 |
| 2018/0082997 A1 * | 3/2018 | Li | | H01L 27/0617 |
| 2018/0174887 A1 * | 6/2018 | Chuang | | H01L 21/76202 |

* cited by examiner

HIGH-VOLTAGE LDMOSFET DEVICES HAVING POLYSILICON TRENCH-TYPE GUARD RINGS

BACKGROUND

Field of the Disclosure

The present disclosure relates to semiconductor technology, and in particular, it relates to a high-voltage semiconductor device having a trench-type guard-ring structure.

Description of the Related Art

High-voltage semiconductor technology is applied to integrated circuits (ICs) with high voltage and high power. Traditional high-voltage semiconductor devices, such as lateral diffused MOSFETs (LDMOSFETs), have advantages that include cost effectiveness and process compatibility, and thus high-voltage semiconductor devices have been widely used in a CMOS (complementary metal oxide semiconductor) type input-output circuit.

Since the CMOS devices typically include a P-type CMOS transistor and an N-type transistor, parasitic PNP and NPN bipolar transistors are typically formed in the CMOS device structure. When these parasitic bipolar transistors are activated, CMOS latch-up may occur.

In order to prevent CMOS latch-up, one approach has been to increase the space between the P-type CMOS transistor and the N-type transistor, thereby increasing the effective base width of the parasitic bipolar transistors. For example, additional well regions with different conductivity types are alternately arranged between the P-type CMOS transistor and the N-type transistor and/or the widths of those additional well regions are increased.

The chip size, however, is increased due to the increment of the space between the transistors. Moreover, some of the parasitic bipolar transistors have a base that is formed of a semiconductor substrate with high resistance. Thus, the parasitic resistance of the base is greatly increased when the spacing between the transistors is increased. As a result, the base-emitter junction is easily forward biased, so that the parasitic bipolar transistors are activated.

Therefore, there is a need to develop a high-voltage semiconductor device that is capable of addressing or mitigating the problems described above.

SUMMARY

In some embodiments of the disclosure, a high-voltage semiconductor device is provided. The high-voltage semiconductor device includes a semiconductor layer formed on a substrate. A first well region having a first conductivity type and a second well region having a second conductivity type are formed in the semiconductor layer. The second conductivity type is different from the first conductivity type. A source region and a drain region are respectively formed in the first well region and the second well region. A field insulating layer is in the second well region between the source region and the drain region. A gate structure is disposed on the semiconductor layer and covers a portion of the field insulating layer. A first isolation trench structure is disposed in the semiconductor layer and surrounds the first well region and the second well region. The first isolation trench structure includes a first polysilicon layer filling a first trench of the first isolation trench structure and having the second conductivity type, a first heavy doping region formed in an upper portion of the first polysilicon layer and having the second conductivity type, and a first insulating liner disposed on sidewalls of the first trench and surrounding the first polysilicon layer.

In some embodiments of the disclosure, a high-voltage semiconductor device is provided. The high-voltage semiconductor device includes a semiconductor layer formed on a substrate and having a first transistor region and a second transistor region. First source and drain regions and second source and drain regions are respectively formed in the first transistor region and the second transistor region. A first gate structure and a second gate structure are respectively disposed on the semiconductor layer corresponding to the first transistor region and the second transistor region. A first isolation trench structure is disposed in the semiconductor layer and surrounds the first transistor region. The first isolation trench structure includes a first polysilicon layer filling a first trench of the first isolation trench structure and having a conductivity type that is the same as that of the first source and drain regions, a first heavy doping region formed in an upper portion of the first polysilicon layer and having a conductivity type that is the same as that of the first polysilicon layer, and a first insulating liner disposed on sidewalls of the first trench and surrounding the first polysilicon layer. A second isolation trench structure is disposed in the semiconductor layer and surrounds the second transistor region. The second isolation trench structure includes a second polysilicon layer filling a second trench of the second isolation trench structure and having a conductivity type that is the same as that of the second source and drain regions, a second heavy doping region formed in an upper portion of the second polysilicon layer and having a conductivity type that is the same as that of the second polysilicon layer, and a second insulating liner disposed on sidewalls of the second trench and surrounding the second polysilicon layer.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
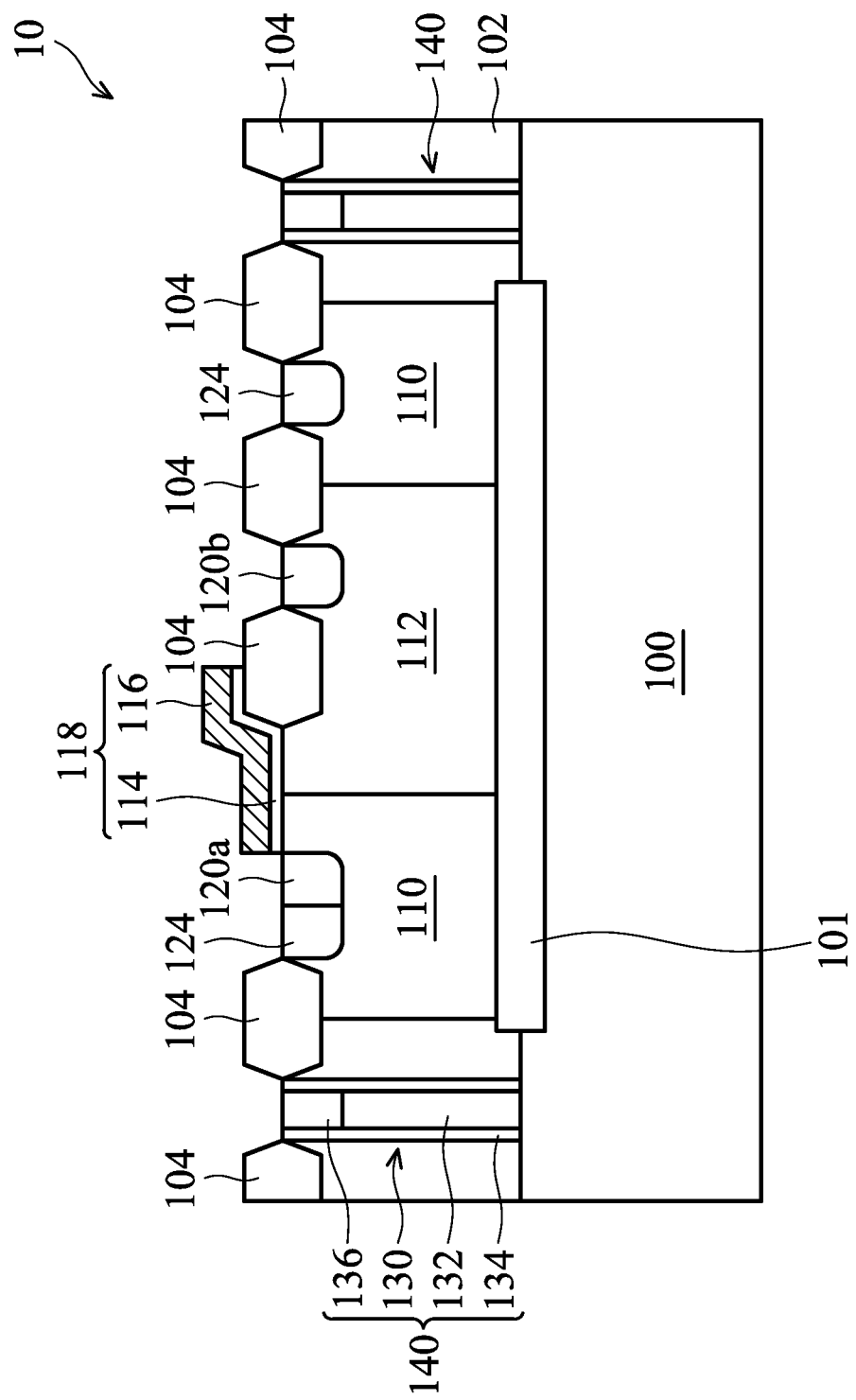
FIG. 1 is a cross section of a high-voltage semiconductor device according to an embodiment of the present disclosure.

The following description is of the best-contemplated mode of carrying out the disclosure. This description is made for the purpose of illustrating the general principles of the disclosure and should not be taken in a limiting sense. These are, of course, merely examples and are not intended to be limited. In addition, the disclosure may repeat reference numerals and/or letters in the various examples. This repetition is for the purpose of simplicity and clarity and does not in itself dictate a relationship between the various embodiments and/or configurations discussed.

Refer to FIG. 1, which illustrates a cross section of a high-voltage semiconductor device 10 according to an embodiment of the present disclosure. In some embodiments, the high-voltage semiconductor device 10 is an LDMOSFET having a trench-type guard-ring structure. In some embodiments, the high-voltage semiconductor device 10 includes a substrate 100, such as a silicon substrate, a SiGe substrate, a bulk semiconductor substrate, a compound semiconductor substrate, a silicon-on-insulator (SOI) substrate, or another well-known semiconductor substrate.

In some embodiments, the substrate 100 includes a semiconductor layer 102, such as an epitaxial layer, formed on the substrate 100 and has the second conductivity type. The semiconductor layer 102 includes a plurality of field insulating layers 104 that serves as an insulating isolation structure. In some embodiments, the semiconductor layer 102 may be replaced by the substrate 100, so that the high-voltage semiconductor device 10 does not have a semiconductor layer 102 therein, and the substrate 100 includes a plurality of field insulating layers 104 therein. In some embodiments, the field insulating layer 104 is a field oxide. In one example, the field insulating layer 104 includes a local oxidation of silicon (LOCOS) structure. In some embodiments, the field insulating layer 104 includes a shallow trench isolation (STI) structure.

In some embodiments, the high-voltage semiconductor device 10 further includes a buried layer 101 formed in the substrate 100 and the semiconductor layer 102. In some other embodiments, the buried layer 101 may be entirely formed in the substrate 100 and adjacent to the top surface of the substrate 100. In some embodiments, the buried layer 101 has a first conductivity type, such as N-type. Moreover, the substrate 100 and the semiconductor layer 102 have a second conductivity type that is different from the first conductivity type, such as P-type.

In some embodiments, the high-voltage semiconductor device 10 further includes a first well region 110 having the first conductivity type (e.g., N-type) and a second well region 112 having the second conductivity type (e.g., P-type) which are formed in the semiconductor layer 102. In some embodiments, the first well region 110 may serve as a body region and extend downward from the top surface of the semiconductor layer 102, so that the bottom of the first well region 110 may contact the top surface of the buried layer 101. Moreover, the second well region 112 may serve a drift region and be surrounded by the first well region 110. Similar to the first well region 110, the second well region 112 extends downward from the top surface of the semiconductor layer 102, so that the bottom of the second well region 112 may contact the top surface of the buried layer 101.

In some embodiments, the first well region 110 and the second well region 112 have the same doping concentration. For example, the doping concentration of the first well region 110 and the second well region 112 is in a range of about $1.0 \times 10^{16}$ to $1.0 \times 10^{17}$ ions/cm$^3$. In some other embodiments, the first well region 110 and the second well region 112 may be high-voltage well regions. In one example, the doping concentration of the high-voltage well regions is in a range of about $1.0 \times 10^{15}$ to $1.0 \times 10^{16}$ ions/cm$^3$.

In some embodiments, the high-voltage semiconductor device 10 further includes a source region 120a, a drain region 120b, and a gate structure 118. The source region 120a and the drain region 120b are respectively disposed in the first well region 110 and the second well region 112. Moreover, a doping region 124 having the first conductivity type is in the first well region 110 and adjacent to the source region 120a. Additionally, the gate structure 118 is disposed on the semiconductor layer 102 and covers a portion of the field insulating layer 104, in which this field insulating layer 104 is formed in the second well region 112 between the source region 120a and the drain region 120b. The gate structure 118 typically includes a gate dielectric layer 114 and a gate layer 116 on the gate dielectric layer 114.

In some embodiments, the high-voltage semiconductor device 10 further includes an isolation trench structure 140 disposed in the semiconductor layer 102 and surrounding the first well region 110 and the second well region 112, so as to form a guard-ring structure. In some embodiments, the isolation trench structure (guard-ring structure) 140 includes a polysilicon layer 132, an insulating liner 134 and a heavy doping region 136. In some embodiments, the polysilicon layer 132 fills a trench 130 of the isolation trench structure 140 and has the second conductivity type. The heavy doping region 136 is formed in the upper portion of the polysilicon layer 132 and also has the second conductivity type. In some embodiments, the heavy doping region 136 has a doping concentration that is greater than that of the polysilicon layer 132 and the doping concentration of the polysilicon layer 132 is greater than that of the second well region 112. The insulating liner 134, such as an oxide liner, is disposed on sidewalls of the trench 130 and surrounds the polysilicon layer 132, thereby preventing a PN junction from being formed in the semiconductor layer 102 via the polysilicon layer 132 having the second conductivity type.

In some embodiments, the trench 130 in the semiconductor layer 102 has a depth that is greater than those of the first well region 110 and the second well region 112. For example, the trench 130 may extend to the top surface of the substrate 100 or into the substrate 100, so that the bottom of the polysilicon layer 132 contacts the substrate 100 to form an electrical connection therebetween. As a result, when the heavy doping region 136 in the upper portion of the polysilicon layer 132 is grounded or electrically connected to a low voltage level (e.g., 0V), the electron holes which are in the substrate 100 and the semiconductor layer 102 and move along the isolation trench structure (guard-ring structure) 140 can be absorbed by the polysilicon layer 132.

In some embodiments, the high-voltage semiconductor device 10 further includes an interlayer dielectric (ILD) layer (not shown) and interconnect structures (not shown) therein. In some embodiments, the interconnect structures include a source electrode electrically connected to the source region 120a, a drain electrode electrically connected to the drain region 120b, and a gate electrode electrically connected to the gate structure 118.

Figure 2:
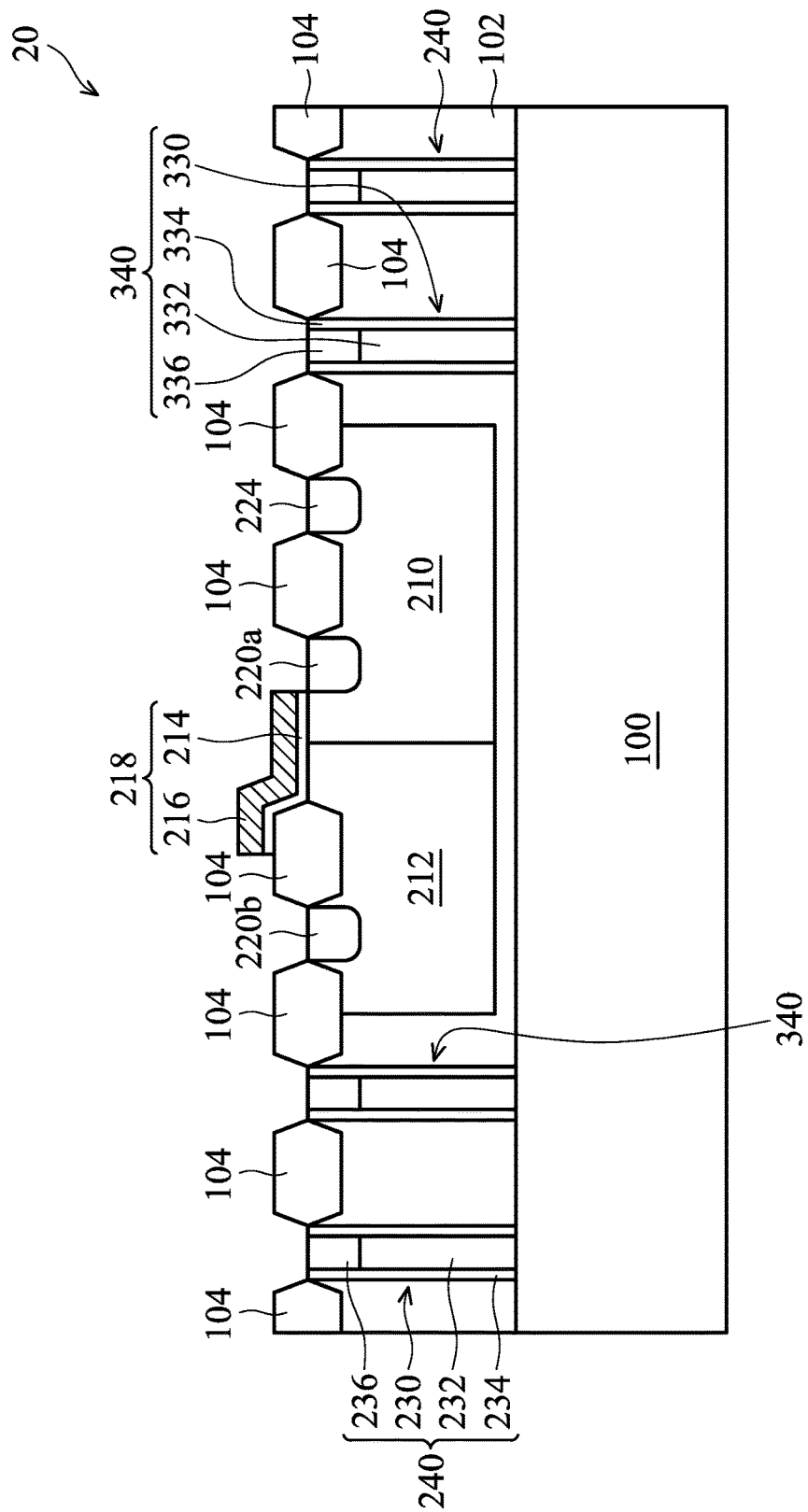
FIG. 2 is a cross section of a high-voltage semiconductor device according to another embodiment of the present disclosure.

Refer to FIG. 2, which a cross section of a high-voltage semiconductor device according to another embodiment of the present disclosure. Elements in FIG. 2 that are the same as or similar to those in FIG. 1 are not described again, for brevity. In some embodiments, the high-voltage semiconductor device 20 is an LDMOSFET having a trench-type guard-ring structure. In some embodiments, the high-voltage semiconductor device 20 includes a substrate 100 and a semiconductor layer 102 formed on the substrate 100. The substrate 100 and the semiconductor layer 102 have a first conductivity type, such as P-type. Moreover, the semiconductor layer 102 includes a plurality of field insulating layers 104 that serves as an insulating isolation structure. In some embodiments, the semiconductor layer 102 may be replaced by the substrate 100, so that the high-voltage semiconductor device 10 does not have a semiconductor layer 102 therein, and the substrate 100 includes a plurality of field insulating layers 104 therein.

In some embodiments, the high-voltage semiconductor device 20 further includes a first well region 210 having the first conductivity type (e.g., P-type) and a second well region 212 having a second conductivity type (e.g., N-type) that is different from the first conductivity type which are formed in the semiconductor layer 102. In some embodiments, the first well region 210 may serve as a body region and extend downward to a depth from the top surface of the semiconductor layer 102. Moreover, the second well region 212 may serve a drift region. Similar to the first well region 210, the second well region 212 extends downward to a depth from the top surface of the semiconductor layer 102.

In some embodiments, the first well region 210 and the second well region 212 have the same doping concentration. For example, the doping concentration of the first well region 210 and the second well region 212 is in a range of about $1.0 \times 10^{16}$ to $1.0 \times 10^{17}$ ions/cm$^3$. In some other embodiments, the first well region 210 and the second well region 212 may be high-voltage well regions. In one example, the doping concentration of the high-voltage well regions is in a range of about $1.0 \times 10^{15}$ to $1.0 \times 10^{16}$ ions/cm$^3$.

In some embodiments, the high-voltage semiconductor device 20 further includes a source region 220a, a drain region 220b, and a gate structure 218. The source region 220a and the drain region 220b having the second conductivity type are respectively disposed in the first well region 210 and the second well region 212. A doping region 224 (body contact region) having the first conductivity type is in the first well region 210. Moreover, the gate structure 218 is disposed on the semiconductor layer 102 and covers a portion of the field insulating layer 104, in which this field insulating layer 104 is formed in the second well region 212 between the source region 220a and the drain region 220b. The gate structure 118 typically includes a gate dielectric layer 214 and a gate layer 216 on the gate dielectric layer 214.

In some embodiments, the high-voltage semiconductor device 20 further includes isolation trench structures 240 and 340 disposed in the semiconductor layer 102. The isolation trench structure 340 surrounds the first well region 210 and the second well region 212, so as to form a first guard-ring structure. Moreover, the isolation trench structure 240 surrounds the isolation trench structure 340, so as to form a second guard-ring structure.

In some embodiments, the isolation trench structure (first guard-ring structure) 340 includes a polysilicon layer 332, an insulating liner 334 and a heavy doping region 336. In some embodiments, the polysilicon layer 332 fills a trench 330 of the isolation trench structure 340 and has the first conductivity type. The heavy doping region 336 is formed in the upper portion of the polysilicon layer 332 and also has the first conductivity type. In some embodiments, the heavy doping region 336 has a doping concentration that is greater than that of the polysilicon layer 332 and the doping concentration of the polysilicon layer 332 is greater than that of the first well region 210. The insulating liner 334, such as an oxide liner, is disposed on sidewalls of the trench 330 and surrounds the polysilicon layer 332, thereby preventing a PN junction from being formed in the semiconductor layer 102 via the polysilicon layer 332 having the first conductivity type.

In some embodiments, the trench 330 in the semiconductor layer 102 has a depth that is greater than those of the first well region 210 and the second well region 312, so that the depth of the isolation trench structure 340 is greater than those of the first well region 210 and the second well region 312. For example, the trench 330 may extend to the top surface of the substrate 100 or into the substrate 100, so that the bottom of the polysilicon layer 332 contacts the substrate 100 to form an electrical connection therebetween. As a result, when the heavy doping region 336 in the upper portion of the polysilicon layer 332 is grounded or electrically connected to a low voltage level (e.g., 0V), the electron holes which are in the substrate 100 and the semiconductor layer 102 can be absorbed by the polysilicon layer 332 of the isolation trench structure (first guard-ring structure) 340.

In some embodiments, the isolation trench structure (second guard-ring structure) 240 includes a polysilicon layer 232, an insulating liner 234 and a heavy doping region 236. In some embodiments, the polysilicon layer 232 fills a trench 230 of the isolation trench structure 240 and has the second conductivity type. The heavy doping region 236 is formed in the upper portion of the polysilicon layer 232 and also has the second conductivity type. In some embodiments, the heavy doping region 236 has a doping concentration that is greater than that of the polysilicon layer 232 and the doping concentration of the polysilicon layer 232 is greater than that of the second well region 212. The insulating liner 234, such as an oxide liner, is disposed on sidewalls of the trench 230 and surrounds the polysilicon layer 232, thereby preventing a PN junction from being formed in the semiconductor layer 102 via the polysilicon layer 232 having the second conductivity type.

In some embodiments, the trench 230 in the semiconductor layer 102 has a depth that is greater than those of the first well region 210 and the second well region 312, so that the depth of the isolation trench structure 240 is greater than those of the first well region 210 and the second well region 312. For example, the trench 230 may extend to the top surface of the substrate 100 or into the substrate 100, so that the bottom of the polysilicon layer 232 contacts the substrate 100 to form an electrical connection therebetween. As a result, when the heavy doping region 236 in the upper portion of the polysilicon layer 232 is electrically connected to a high voltage level (e.g., 5V), the electrons which are in the substrate 100 and the semiconductor layer 102 and move along the isolation trench structure (second guard-ring structure) 240 can be absorbed by the polysilicon layer 232.

In some embodiments, the high-voltage semiconductor device 20 further includes an ILD layer (not shown) and interconnect structures (not shown) therein. In some embodiments, the interconnect structures include a source electrode electrically connected to the source region 220a, a drain electrode electrically connected to the drain region 220b, and a gate electrode electrically connected to the gate structure 218.

Figure 3:
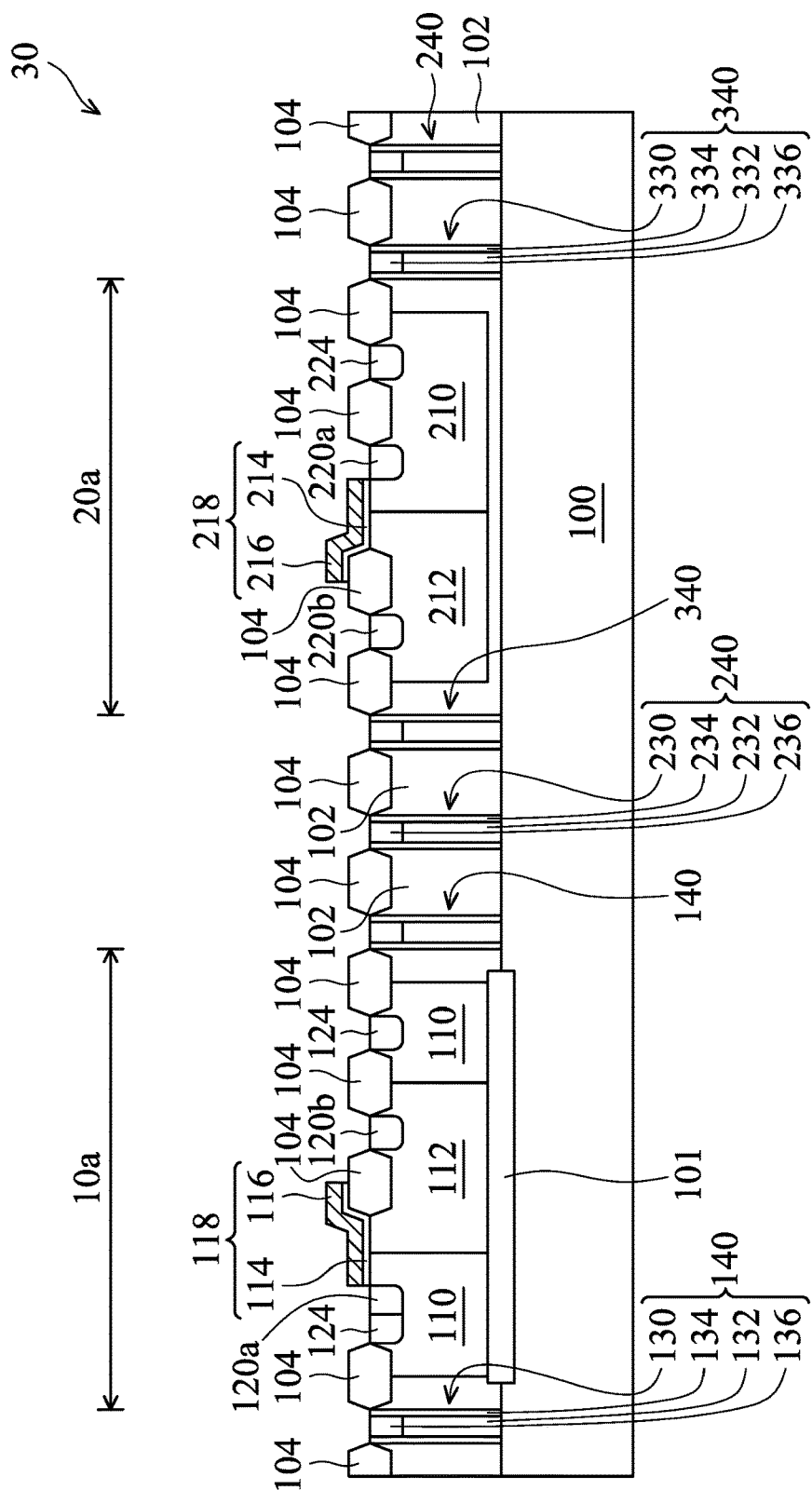
FIG. 3 is a cross section of a high-voltage semiconductor device according to yet another embodiment of the present disclosure.

Refer to FIG. 3, which a cross section of a high-voltage semiconductor device 30 according to yet another embodiment of the present disclosure. Elements in FIG. 3 that are the same as or similar to those in FIGS. 1 and 2 are not described again, for brevity. In some embodiments, the high-voltage semiconductor device 30 includes a CMOS transistor that formed by two LDMOSFETs having a trench-type guard-ring structure. In some embodiments, the high-voltage semiconductor device 30 includes a substrate 100 and a semiconductor layer 102 formed on the substrate 100. The substrate 100 and the semiconductor layer 102 have the same conductivity type, such as P-type. Moreover, the semiconductor layer 102 includes a first transistor region 10a and a second transistor region 20a. For example, the first transistor region 10a is a P-type transistor region and the second transistor region 20a is an N-type transistor region. Each of the transistor regions 10a and 20a includes a plurality of field insulating layers 104 that serves as an insulating isolation structure. In some embodiments, the semiconductor layer 102 may be replaced by the substrate 100, so that the high-voltage semiconductor device 30 does not have a semiconductor layer 102 therein, and the substrate 100 includes a plurality of field insulating layers 104 therein.

In some embodiments, the first transistor region 10a includes a first well region 110 (N-type) and a second well region 112 (P-type) that have different conductivity types and the second transistor region 20a includes a first well region 210 (P-type) and a second well region 212 (N-type) that have different conductivity types. Moreover, the arrangement of the first well regions 110 and 210 and the second well region 112 and 212 is similar to those of the high-voltage semiconductor devices 10 and 20 shown in FIGS. 1 and 2.

In some embodiments, the high-voltage semiconductor device 30 further includes a source region 120a and a drain region 120b formed in the first transistor region 10a, and a source region 220a and a drain region 220b formed in the second transistor region 20a. Moreover, a gate structure 118 and a gate structure 218 are disposed on the first transistor region 10a and the second transistor region 20a of the semiconductor layer, respectively.

Similar to the high-voltage semiconductor device 10 shown in FIG. 1, the high-voltage semiconductor device 30 may have a buried layer 101 contacting the bottoms of the first well region 110 and the second well region 112. Moreover, there is a doping region 124 in the first well region 110 and adjacent to the source region 120a. Also, similar to the high-voltage semiconductor device 20 shown in FIG. 2, there is a doping region 224 in the first well region 210 to serve as a body contact region.

In some embodiments, the high-voltage semiconductor device 30 further includes isolation trench structures 140, 240 and 340 disposed in the semiconductor layer 102. The isolation trench structure 140 surrounds the first transistor region 10a, so as to form a first guard-ring structure. The isolation trench structure 340 surrounds the second transistor region 20a, so as to form a second guard-ring structure. Moreover, the isolation trench structure 240 surrounds the isolation trench structure 340, so as to form a third guard-ring structure.

In some embodiments, the isolation trench structure (first guard-ring structure) 140 includes a polysilicon layer 132, an insulating liner 134 and a heavy doping region 136. Moreover, the isolation trench structure (second guard-ring structure) 340 includes a polysilicon layer 332, an insulating liner 334 and a heavy doping region 336. Additionally, the isolation trench structure (third guard-ring structure) 240 includes a polysilicon layer 232, an insulating liner 234 and a heavy doping region 236.

In some embodiments, the depth of the isolation trench structure 140 is greater than those of the first well region 110 and the second well region 112, and the bottom of the polysilicon layer 132 contacts the substrate 100. Moreover, the depths of the isolation trench structures 240 and 340 are greater than those of the first well region 210 and the second well region 212, and the bottoms of the polysilicon layers 232 and 332 contact the substrate 100.

In some embodiments, the high-voltage semiconductor device 30 further includes an ILD layer (not shown) and interconnect structures (not shown) therein. In some embodiments, the interconnect structures include source electrodes, drain electrodes, and gate electrodes.

It should be understood that the high-voltage semiconductor devices 20, 30, 40, and 50 shown in FIGS. 2A to 2D respectively can be fabricated by a method that is the same as or similar to the method shown in FIGS. 1A to 1G.

According to the foregoing embodiments, the polysilicon layer and the overlying heavy doping region in the isolation trench structure can be utilized to absorb electron holes and electrons in the substrate and/or the overlying semiconductor layer. Moreover, since the insulating liner in the isolation trench structure can prevent a PN junction from being formed in the semiconductor layer via the polysilicon layer in the isolation trench structure, the number of parasitic bipolar transistors can be reduced, thereby preventing latch-up. Additionally, compared to the additional well regions disposed between the PMOS transistor and NMOS transistor in the conventional CMOS circuit, the isolation trench structure can have a narrower width than such additional well regions. Therefore, the chip size can be effectively reduced, while reducing the parasitic resistance of the parasitic bipolar transistors to prevent latch-up.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A high-voltage semiconductor device, comprising:
a semiconductor layer formed on a substrate;
a first well region having a first conductivity type and a second well region having a second conductivity type formed in the semiconductor layer, wherein the second conductivity type is different from the first conductivity type;
a source region and a drain region respectively formed in the first well region and the second well region;
a field insulating layer in the second well region between the source region and the drain region;
a gate structure disposed on the semiconductor layer and covering a portion of the field insulating layer;
a first isolation trench structure disposed in the semiconductor layer and surrounding the first well region and the second well region, wherein the first isolation trench structure comprises:
a first polysilicon layer filling a first trench of the first isolation trench structure and having the second conductivity type;
a first heavy doping region formed in an upper portion of the first polysilicon layer and having the second conductivity type; and
a first insulating liner disposed on sidewalls of the first trench and surrounding the first polysilicon layer; and
a second isolation trench structure disposed in the semiconductor layer and surrounding the first well region and the second well region, wherein the second isolation trench structure comprises:
a second polysilicon layer filling a second trench of the second isolation trench structure and having the first conductivity type;
a second heavy doping region formed in an upper portion of the second polysilicon layer and having the first conductivity type; and
a second insulating liner disposed on sidewalls of the second trench and surrounding the second polysilicon layer.

2. The device as claimed in claim 1, wherein the first isolation trench structure has a depth that is greater than those of the first well region and the second well region.

3. The device as claimed in claim 1, wherein a bottom of the first polysilicon layer contacts the substrate.

4. The device as claimed in claim 1, wherein the second isolation trench structure has a depth that is greater than those of the first well region and the second well region.

5. The device as claimed in claim 1, wherein a bottom of the second polysilicon layer contacts the substrate.

6. The device as claimed in claim 1, wherein the first isolation trench structure surrounds the second isolation trench structure.

7. A high-voltage semiconductor device, comprising:
a semiconductor layer formed on a substrate and having a first transistor region and a second transistor region;
first source and drain regions and second source and drain regions respectively formed in the first transistor region and the second transistor region;
a first gate structure and a second gate structure respectively disposed on the semiconductor layer corresponding to the first transistor region and the second transistor region;
a first isolation trench structure disposed in the semiconductor layer and surrounding the first transistor region, wherein the first isolation trench structure comprises:
a first polysilicon layer filling a first trench of the first isolation trench structure and having a conductivity type that is the same as that of the first source and drain regions;
a first heavy doping region formed in an upper portion of the first polysilicon layer and having a conductivity type that is the same as that of the first polysilicon layer; and
a first insulating liner disposed on sidewalls of the first trench and surrounding the first polysilicon layer;
a second isolation trench structure disposed in the semiconductor layer and surrounding the second transistor region, wherein the second isolation trench structure comprises:
a second polysilicon layer filling a second trench of the second isolation trench structure and having a conductivity type that is the same as that of the second source and drain regions;
a second heavy doping region formed in an upper portion of the second polysilicon layer and having a conductivity type that is the same as that of the second polysilicon layer; and
a second insulating liner disposed on sidewalls of the second trench and surrounding the second polysilicon layer; and a third isolation trench structure disposed in the semiconductor layer and surrounding the second transistor region, wherein the third isolation trench structure comprises:
a third polysilicon layer filling a third trench of the third isolation trench structure and having a conductivity type that is different from that of the second source and drain regions;
a third heavy doping region formed in an upper portion of the third polysilicon layer and having a conductivity type that is the same as that of the third polysilicon layer; and
a third insulating liner disposed on sidewalls of the third trench and surrounding the third polysilicon layer.

8. The device as claimed in claim 7, further comprising a first well region and a second well region formed in the first transistor region, wherein the first source and drain regions are respectively formed in the first well region and the second well region.

9. The device as claimed in claim 8, wherein the first isolation trench structure has a depth that is greater than those of the first well region and the second well region.

10. The device as claimed in claim 7, further comprising a buried layer contacting bottoms of the first well region and the second well region, wherein the buried layer has a conductivity type that is different from that of the first source and drain regions.

11. The device as claimed in claim 7, further comprising a first well region and a second well region formed in the second transistor region, wherein the second source and drain regions are respectively formed in the first well region and the second well region.

12. The device as claimed in claim 11, wherein the second isolation trench structure has a depth that is greater than those of the first well region and the second well region.

13. The device as claimed in claim 11, wherein the third isolation trench structure has a depth that is greater than those of the first well region and the second well region.

14. The device as claimed in claim 7, wherein bottoms of the first polysilicon layer and the second polysilicon layer contact the substrate.

15. The device as claimed in claim 7, wherein the second isolation trench structure surrounds the third isolation trench structure.

16. The device as claimed in claim 7, wherein a bottom of the third polysilicon layer contacts the substrate.

* * * * *